US012432922B2

(12) United States Patent
Ma et al.

(10) Patent No.: US 12,432,922 B2
(45) Date of Patent: Sep. 30, 2025

(54) METHOD AND APPARATUS TO MITIGATE WORD LINE STAIRCASE ETCH STOP LAYER THICKNESS VARIATIONS IN 3D NAND DEVICES

(71) Applicant: INTEL NDTM US LLC, Santa Clara, CA (US)

(72) Inventors: Hong Ma, Singapore (SG); Sha Tao, Dalian (CN); Qun Li, Liaoning (CN)

(73) Assignee: Intel NDTM US LLC, Santa Clara, CA (US)

(*) Notice: Subject to any disclaimer, the term of this patent is extended or adjusted under 35 U.S.C. 154(b) by 333 days.

(21) Appl. No.: 18/002,513

(22) PCT Filed: Jul. 23, 2020

(86) PCT No.: PCT/CN2020/103811
§ 371 (c)(1),
(2) Date: Dec. 20, 2022

(87) PCT Pub. No.: WO2022/016455
PCT Pub. Date: Jan. 27, 2022

(65) Prior Publication Data
US 2023/0232629 A1 Jul. 20, 2023

(51) Int. Cl.
*H10B 43/27* (2023.01)
*G11C 16/04* (2006.01)
(Continued)

(52) U.S. Cl.
CPC ......... *H10B 43/27* (2023.02); *G11C 16/0483* (2013.01); *H01L 21/76877* (2013.01);
(Continued)

(58) Field of Classification Search
CPC ........ H10B 41/40; H10B 43/40; H10B 41/20; H10B 43/20; H10B 41/27; H10B 43/27; H01L 21/76829; H01L 21/76832
See application file for complete search history.

(56) References Cited

U.S. PATENT DOCUMENTS

| 9,437,483 B2 | 9/2016 | Lee et al. |
| 2020/0144380 A1 | 5/2020 | Hwang et al. |

(Continued)

FOREIGN PATENT DOCUMENTS

| CN | 104396004 A | 3/2015 |
| CN | 110140212 A | 8/2019 |
| CN | 111180418 A | 5/2020 |

OTHER PUBLICATIONS

EPO European Extended Search Report in EP Application Serial No. 20945898.3 mailed on Mar. 13, 2024, 12 pages.
(Continued)

*Primary Examiner* — John A Bodnar
(74) *Attorney, Agent, or Firm* — Morgan, Lewis & Bockius LLP

(57) ABSTRACT

An apparatus, a method and a system. The apparatus comprises a memory array including word lines defining a staircase structure, and a staircase etch stop layer including: a sandwich etch stop layer disposed on a top region the staircase and including a first etch stop layer and a third etch stop layer of a first material, and a second etch stop layer sandwiched between the first etch stop layer and the third etch stop layer and made of a second material having etch properties different from the first material; a precut etch stop layer disposed at a region of the staircase structure below the top region and including the second etch stop layer and the third etch stop layer and not the first etch stop layer; and contact structures extending through a dielectric layer and
(Continued)

the staircase etch stop layer and landing on the word lines at the staircase structure.

21 Claims, 15 Drawing Sheets

(51) Int. Cl.
    *H01L 21/768*     (2006.01)
    *H01L 23/522*     (2006.01)
    *H01L 23/528*     (2006.01)
    *H10B 41/27*     (2023.01)
    *H10B 41/35*     (2023.01)
    *H10B 43/35*     (2023.01)

(52) U.S. Cl.
    CPC ...... *H01L 23/5226* (2013.01); *H01L 23/5283* (2013.01); *H10B 41/27* (2023.02); *H10B 41/35* (2023.02); *H10B 43/35* (2023.02)

(56) References Cited

U.S. PATENT DOCUMENTS

2020/0152654 A1*   5/2020   Hwang .................. H10B 41/20
2020/0203367 A1    6/2020   Cheon et al.

OTHER PUBLICATIONS

International Search Report and Written Opinion for Application No. PCT/CN2020/103811, mailed on Apr. 22, 2021; 7 pages.
PCT International Preliminary Report on Patentability in PCT International Application Serial No. PCT/CN2020/103811 mailed on Feb. 2, 2023 (6 pages).

* cited by examiner

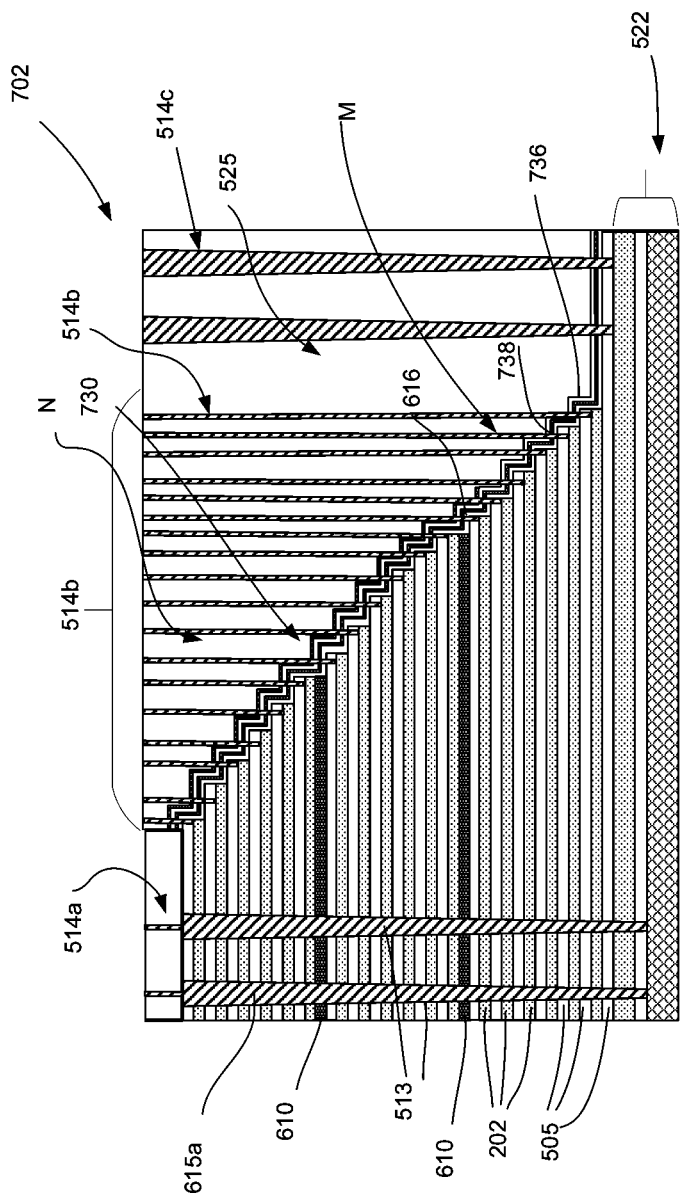

METHOD AND APPARATUS TO MITIGATE WORD LINE STAIRCASE ETCH STOP LAYER THICKNESS VARIATIONS IN 3D NAND DEVICES

This application a national phase filing under 35 U.S.C. § 371 of International Application No. PCT/CN2020/103811, filed Jul. 23, 2020 and titled "METHOD AND APPARATUS TO MITIGATE WORD LINE STAIRCASE ETCH STOP LAYER THICKNESS VARIATIONS IN 3D NAND DEVICES." The disclosure of the prior application is considered part of and hereby incorporated by reference in its entirety in the disclosure of this application.

FIELD

The present disclosure relates in general to the field of computer development, and more specifically, to memory device fabrication.

BACKGROUND

Methods of forming trenches (or vias) for the formation of contact structures to contact word lines defining a staircase structure of a 3D NAND memory device typically include an etch process involving etching through a nitride etch stop layer, and thereafter etching through one or more underlying oxide layers to reach/end at the intended word lines. As 3D NAND devices evolve, they tend to use a larger number of word lines, and therefore to exhibit a larger depth in a direction from the 3D NAND device bit lines to word lines situated closer to a supporting substrate of the device. The reach of vias in newer generation 3D NAND devices may run from about 200 nm up to 13 microns vias formed after the nitride etch stop layer etch process, and after the etch process through the one or more oxide layers, tend to exhibit an overetch at a region of the staircase furthest from the supporting substrate (top region of the staircase), and to exhibit an underetch at a region of the staircase closest to the supporting substrate, that is, deeper within the device and lowest on the staircase structure.

Methods are needed to provide contact vias in 3D NAND devices that mitigate etch variations in the etch results for a nitride etch stop layer (and subsequent oxide layers) resulting from overetch and underetch at, respectively, shallower and deeper regions of the 3D NAND device staircase structure.

BRIEF DESCRIPTION OF THE DRAWINGS

FIGS. 7A-7E illustrate successive side cross-sectional views of a 3D NAND block corresponding to successive configurations of the block as it is subjected to a contact structure formation process according to some embodiments.

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
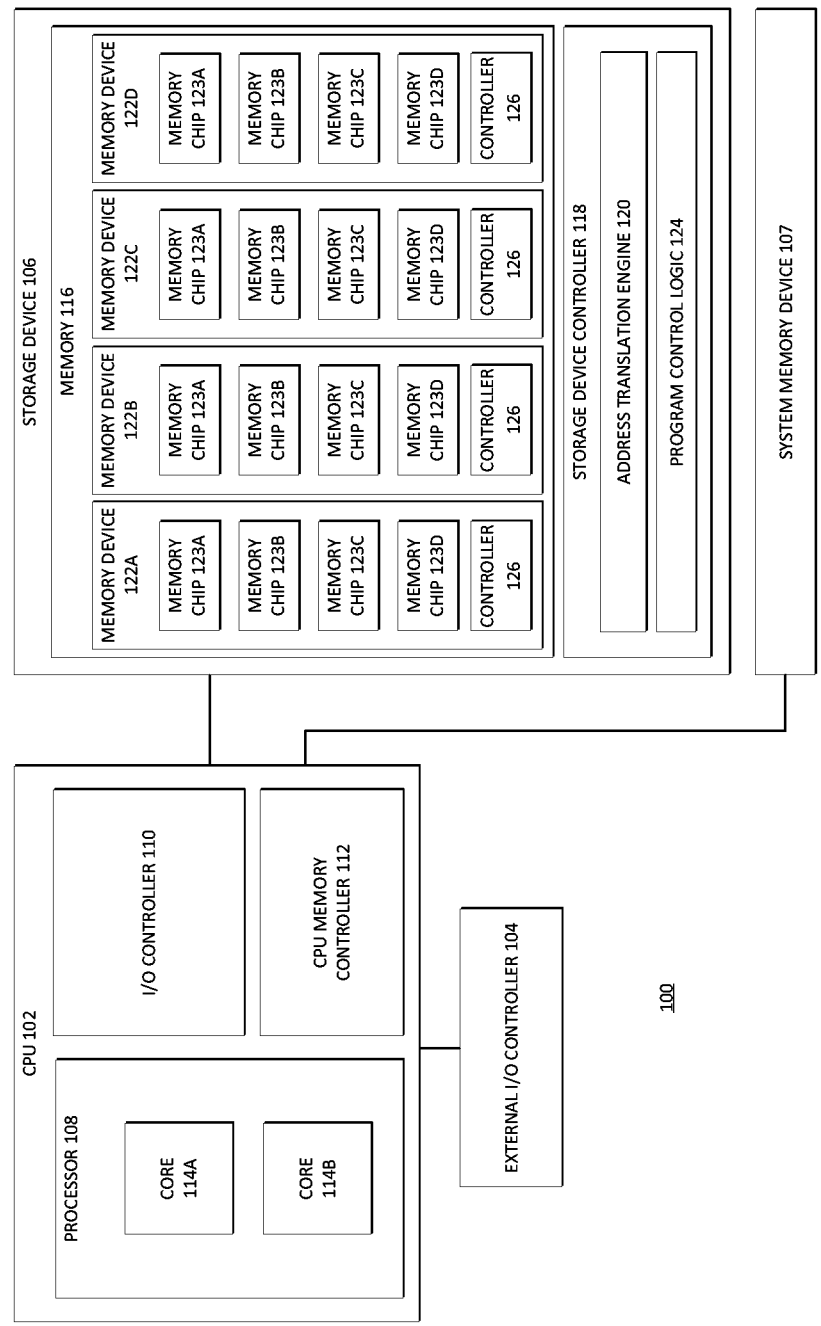
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

Some embodiments pertain to a method and apparatus to mitigate word line staircase etch stop layer thickness variations in 3D NAND devices. More details will be set forth regarding embodiments in the context of FIGS. 7A-7E below.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., word lines) and columns (e.g., bit lines), three dimensional structures, and/or other manner. In various embodiments, the cells may be logically grouped into banks, blocks, sub-blocks, planes, word lines, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more word lines of the physical memory location, one or more bit lines of the physical memory location, or other suitable identifiers or encodings thereof.

In various embodiments, the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may provide the various voltages (or information indicating which voltages should be provided) that are applied to one or more memory cells, word lines, bit lines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
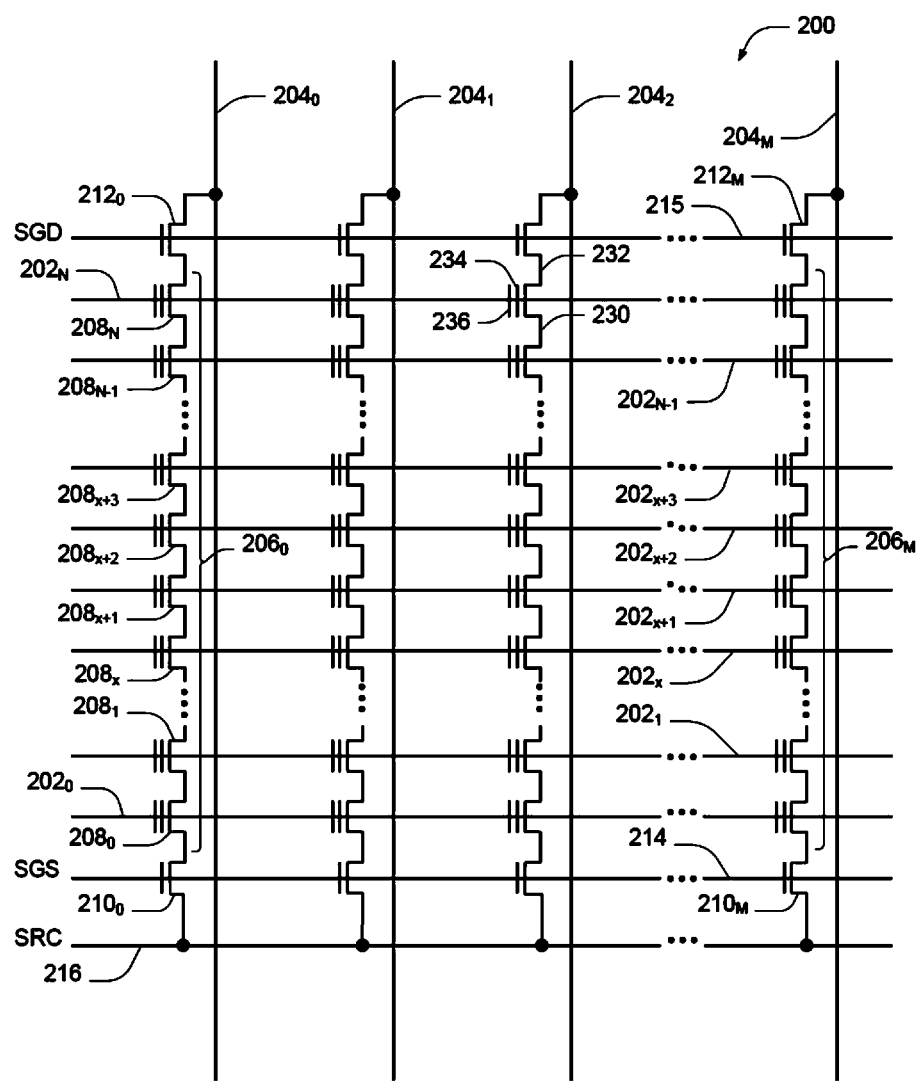
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor), and a select transistor 212 (e.g., a field-effect transistor), such as one of the select transistors $212_0$ to $212_M$ (e.g., that may each be a drain select transistor). Select transistors $210_0$ to $210_M$ may be commonly connected to a select line 214 or select gate source (SGS), such as a source select line, and select transistors $212_0$ to $212_M$ may be commonly connected to a select line 215 or select gate drain (SGD), such as a drain select line. In a particular embodiment, a SGD may be coupled to the drain select transistors of an entire subblock (and each subblock may have its own drain select line) while a SGS may be coupled to the source select transistors of an entire block (and each block may have its own source select line).

A source of each select transistor 210 may be connected to common source line (SRC) 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line SGD 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source SRC 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line 202N and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. For particular memory devices, all memory cells of a particular subblock commonly connected to a given word line may be deemed a physical page. For example, memory cells that are coupled to a particular word line in a subblock may comprise a first physical page, memory cells that are coupled to the particular word line in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
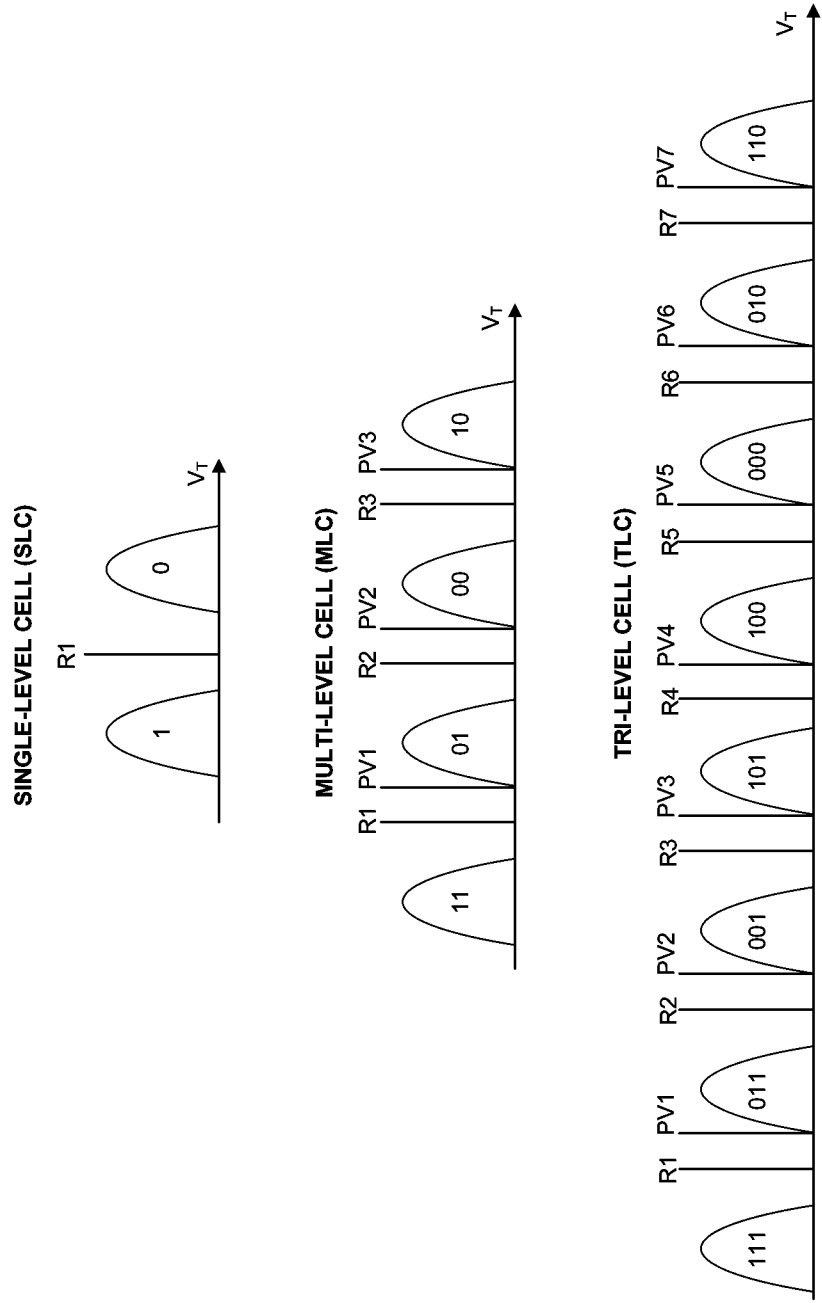
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a word line when the values of cells coupled to that word line are being read. When a particular read voltage is applied, sense circuitry may determine whether the threshold value of a cell is greater than or less than the read voltage based on a voltage or current sensed by the sense circuitry via the bit line of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droppage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same word line. For example, the group of cells that is programmed may be identified by a particular word line and a particular subblock. The group of cells may store one page of data (if the cells are encoded according to an SLC scheme) or multiple pages of data (if the cells are encoded according to an MLC, TLC, QLC, or other multi-level encoding scheme).

Figure 4:
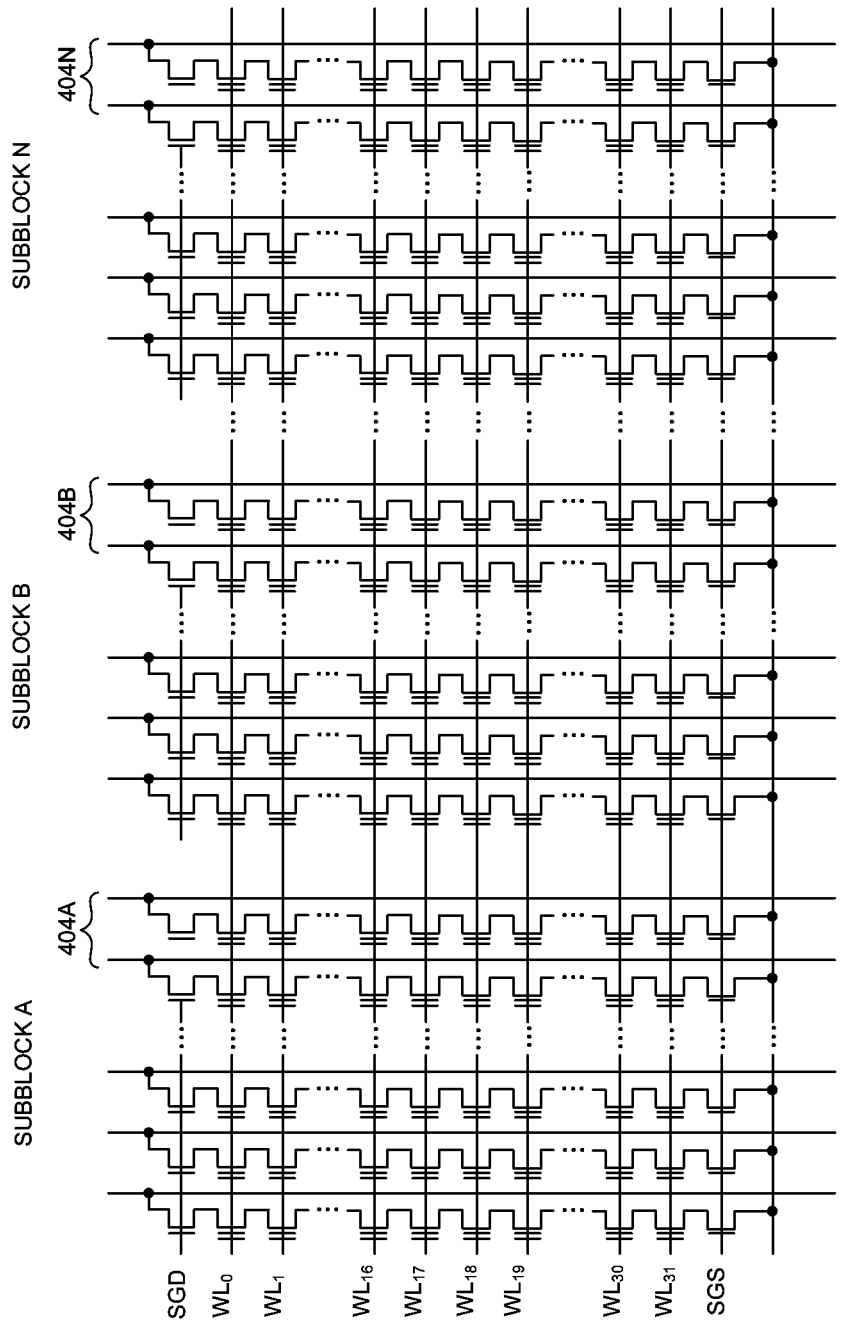
FIG. 4 illustrates example subblocks of a block of a memory device in accordance with certain embodiments.

FIG. 4 depicts memory cells of a memory array arranged into a plurality of subblocks (subblocks 404A-404N) in accordance with certain embodiments. In a particular embodiment, memory cells of an array 200 of chip 123 may be arranged into subblocks and blocks. As an example, a subblock may comprise a number of series strings and a block may comprise a number of subblocks. In various embodiments, a source select line (controlled by source gate select signal SGS) is shared by each series string of a block and each series string of a particular subblock shares a drain select line (controlled by drain gate select signal SGD) with each subblock having its own drain select line.

In a particular embodiment, a subblock may contain a single physical page of memory for each word line of the subblock (in other embodiments, a subblock may contain multiple physical pages of memory for each word line). Thus, a block of memory may be divided into a large number of physical pages. As described above, a logical page may be a unit of programming or reading that contains a number of bits equal to the number of cells in a physical page. In a memory that stores one bit per cell (e.g., an SLC memory), one physical page stores one logical page of data. In a memory that stores two bits per cell (e.g., an MLC memory), a physical page stores two logical pages.

Figure 5:
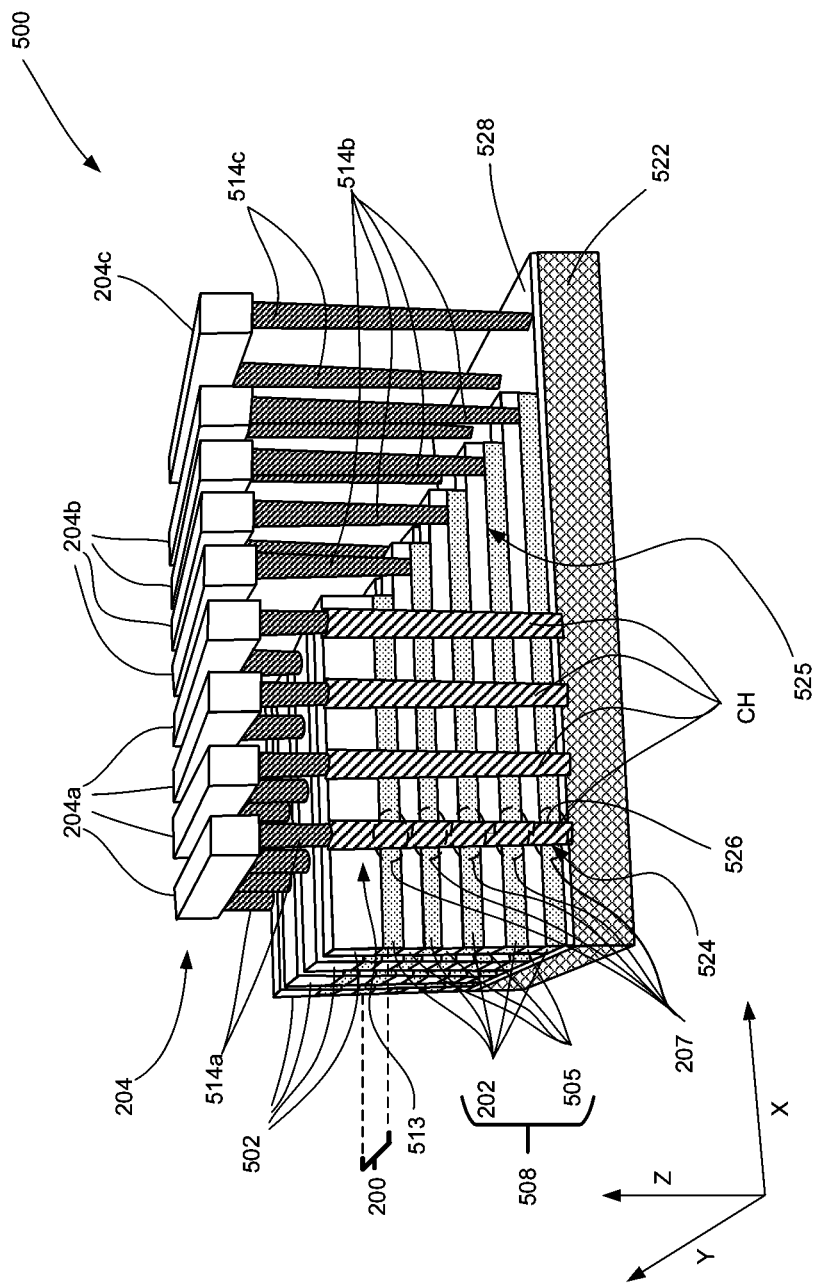
FIG. 5 illustrates a schematic, perspective view of a 3D NAND device according to one embodiment.

FIG. 5 illustrates an example perspective view diagram of a tile 500 of NAND flash memory arrays, such as a stack of arrays similar to array 200 of FIG. 2. A tile of memory blocks includes several memory blocks, e.g., 200 blocks, where each block is comprised of a stack (e.g., a 32 tier stack) of memory cell pages. Each memory cell block 502 includes a word line stack, each stack including a plurality of word lines 202 and a plurality of interlayer dielectrics/ interlayer dielectric layers 505. The word lines 202 are interposed between the interlayer dielectrics 505 (collectively, a word line stack 508) in an alternating manner, according to one embodiment. The word lines 202 are a simplified representations of a number of word lines (e.g., 32 word lines or more) that may be included in a NAND 3D memory array, such as a NAND 3D memory array corresponding to FIG. 2. At least some of word lines 202 may correspond to word lines 202 of FIG. 2. The word lines 202 are conductive layers such as silicon layers or polysilicon layers, according to one embodiment. The interlayer dielectrics 505 are simplified representation of a number of dielectric layers that may be used to separate the word lines 202, according to one embodiment. The interlayer dielectrics 505 may include oxide layers, according to one embodiment. Referring still to FIG. 5, tile 500 further includes bit lines 204a and contact structures 204b extending substantially perpendicularly to the word lines 202 or blocks 502 in the shown embodiment.

Tile 500 of FIG. 5 is supported by a substrate structure 522 with an insulating layer (now shown) that encompasses the shown tile 500. The insulating layer may be formed of an insulating material, such as a bonding dielectric layer, having a predetermined thickness, and including, for example, at least one of, for example, SiO, SiN, SiCN, SiOC, SiON, and SiOCN.

Tile 500 is situated on a substrate structure or substrate 522, such as a silicon substrate, which includes control circuitry therein (not shown), such as control circuitry including transistors, row decoders, page buffers, etc. Pillars 513 are disposed to penetrate the stacks and to define channels CH. First contact structures 514a connect bit lines 204a to respective channels CH and thus couple the bit lines 204a to corresponding memory cells 208 defined by the channels CH. Memory cells 208 may correspond to memory cells 208 of FIG. 2. Bit lines 204a may correspond to bit lines 204 of FIG. 2. Second contact structures 514b are configured to apply a signal to the word lines 202, and are connected to contact structures 204b as shown. Third contact structures 514c are configured to connect contact structures (one of which is shown) 204c directly to control circuitry within the substrate structure 522. The control circuitry of substrate structure 522 may include, for example, a memory partition controller such as memory partition controller 210, bit line control logic such as bit line control logic 216, and word line control logic such as word line control logic 214 of FIG. 2. Each row of word lines 202 across multiple blocks 207 extending in the Y direction and including the corresponding channel sections as coupled to corresponding bit lines would define a memory array 200, and may correspond to a memory array such as memory array 200 of FIG. 2.

The word lines 202 may be disposed to form a staircase 525, shown in FIG. 5, in the X direction and to form a staircase (not shown) in the Y direction. A predetermined region, including end portions of the word lines 202, may be exposed by the steps. In the regions, the word lines 202 may be connected to first contact structures 514a. The word lines 202 may be disposed to be separated in predetermined units by separation regions in the Y direction. The word lines 202 may constitute a single memory block between a pair of the separation regions, but the scope of the memory block is not limited thereto.

The interlayer dielectrics 505 may be disposed between the word lines 202. Similarly to the word lines 202, the interlayer dielectrics 505 may be spaced apart from each other in both the Y direction and the Z direction. The interlayer dielectrics 505 may include an insulating material, such as a silicon oxide or a silicon nitride. The channels CH may be spaced apart from each other, while forming rows in the Y direction and columns in the Z direction. In example embodiments, the channels CH may be disposed to form a lattice pattern or may be disposed in a zigzag manner in one direction. Each of the channels CH may have a pillar shape and may have an inclined side surface which becomes narrower as it comes close to the substrate structure 522.

A channel region 524 may define each of the channels CH. In each of the channels CH, the channel region 524 may be formed to have an annular shape. However, in other example embodiments, the channel region 524 may be formed to have a circular shape or a prismatic shape. The channel region 524 may be connected to an epitaxial layer 528 above substrate structure 522. The channel region 524 may include a semiconductor material, such as polycrystalline silicon or monocrystalline silicon. The semiconductor material may be an undoped material or a material containing p-type or n-type impurities.

A gate dielectric layer 526 may be disposed between the word lines 202 and the channel region 524. Although not illustrated in detail, the gate dielectric layer 526 may include a tunneling layer, a charge storage layer, and a blocking layer which are sequentially stacked from the channel region 524. The tunneling layer may be configured to tunnel charges to the charge storage layer and may include, for example, silicon oxide (SiO.sub.2), silicon nitride (Si.sub.3N.sub.4), silicon oxynitride (SiON), or combinations thereof. The charge storage layer may be a charge trapping layer or a floating gate conductive layer. The blocking layer may include silicon oxide (SiO.sub.2), silicon nitride (Si.sub.3N.sub.4), oxynitride (SiON), a high-k dielectric material, or combinations thereof.

First, second and third contact structures 514a, 514b and 514c, Bit lines 204a, and contract structures 204b and 204c, which are interconnection structures for forming an electrical connection to the substrate structure 522, may include a conductive material. The interconnection structures may include, for example, tungsten (W), aluminum (Al), copper (Cu), tungsten nitride (WN), tantalum nitride (TaN), titanium nitride (TiN), or combinations thereof. Each of the contact structures may have a cylindrical shape. In example embodiments, each of the first and second contact structures may have a inclined side surface which becomes narrower as it comes close to the substrate structure 522.

Figure 6A:
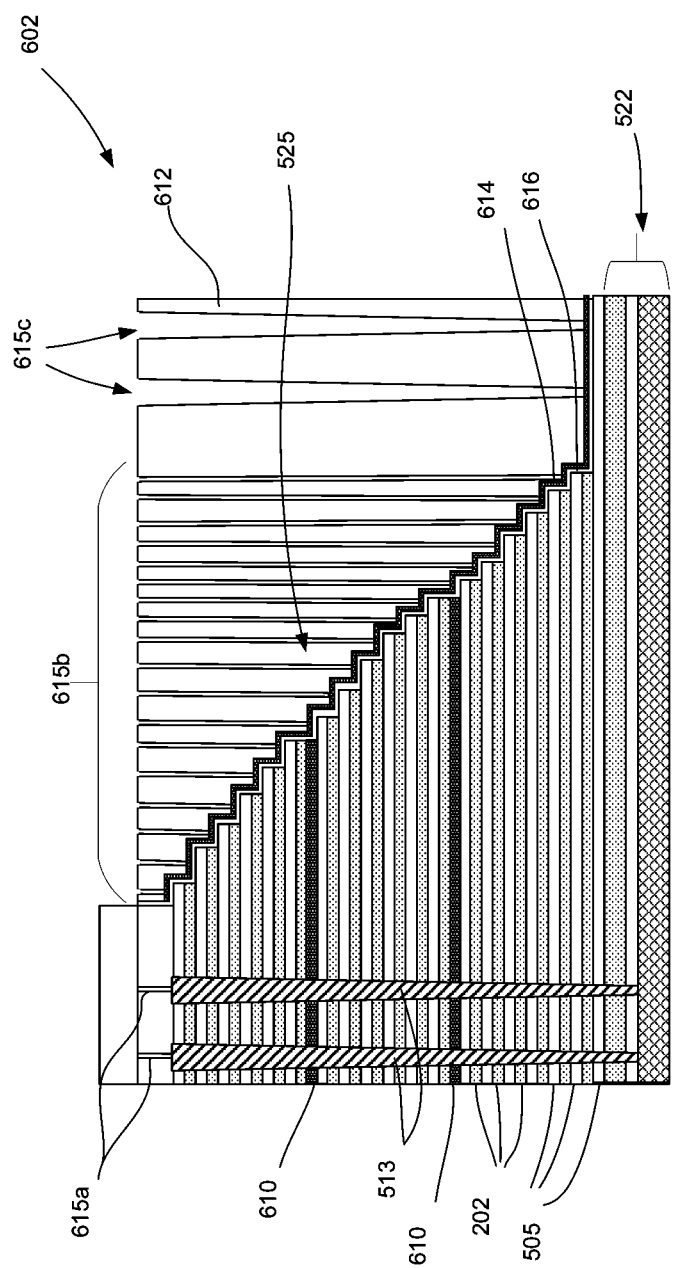
FIGS. 6A-6C illustrate successive side cross-sectional views of a 3D NAND block corresponding to successive configurations of the block as it is subjected to a contact structure formation process according to the current state of the art.
Figure 6B:
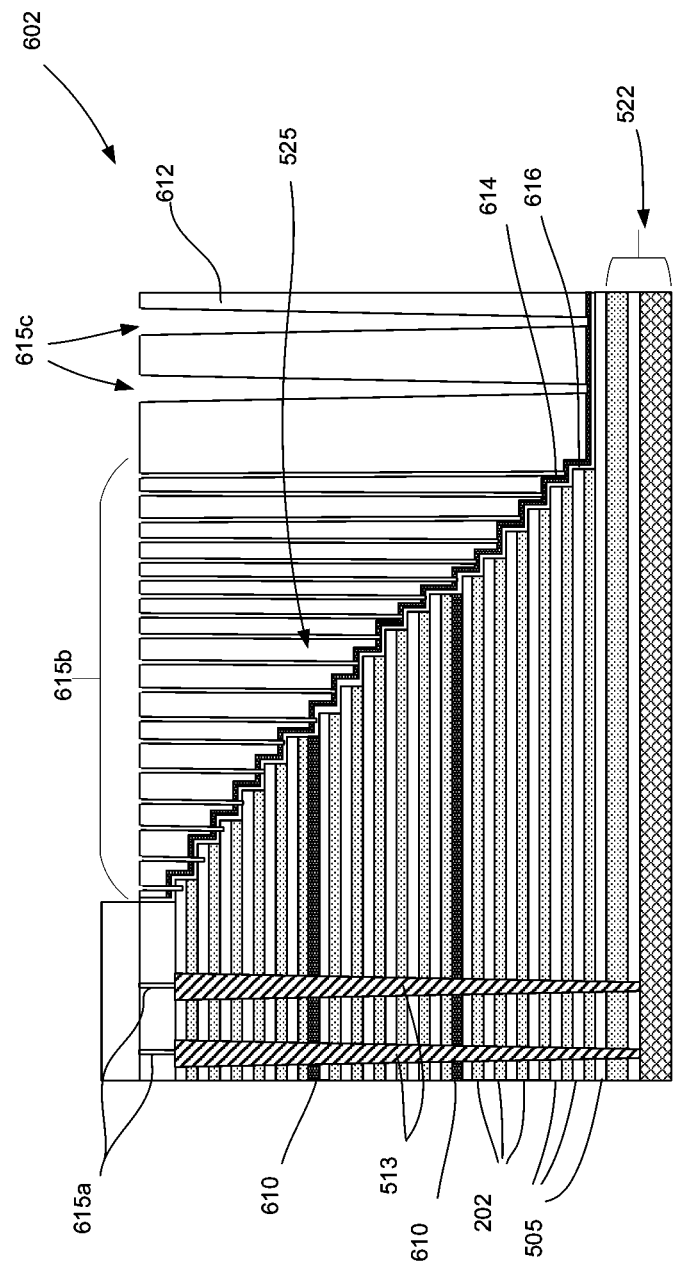
Figure 6C:
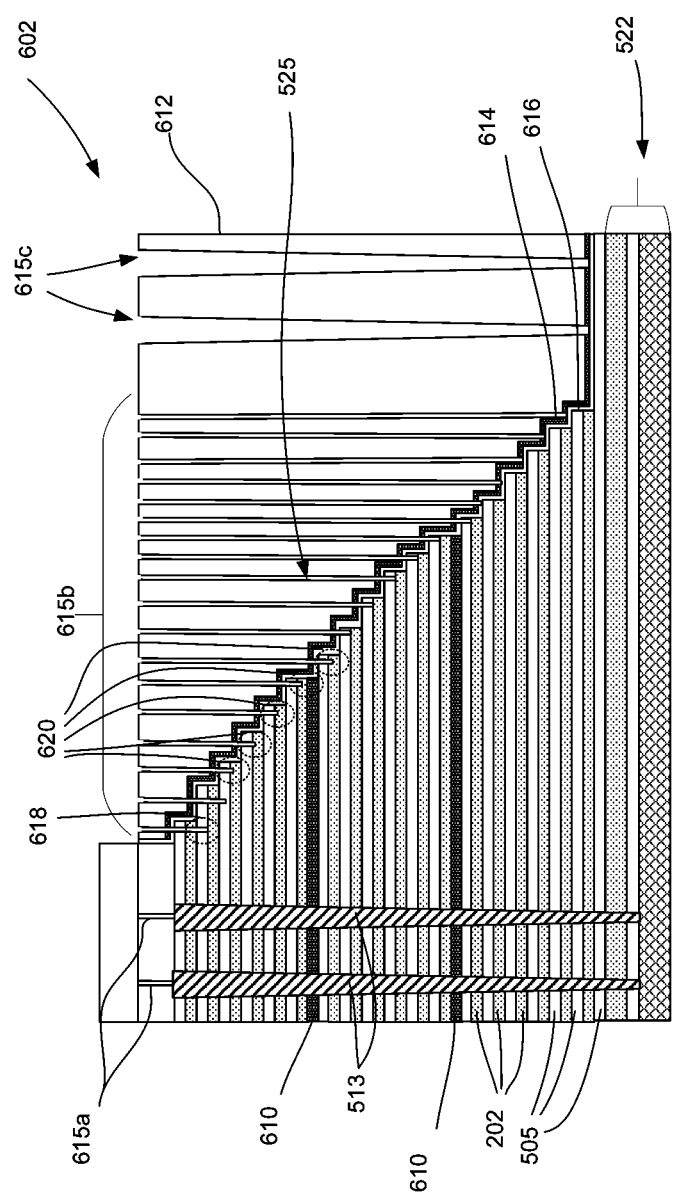

Reference is now made to FIGS. 6A-6C, which show successive side cross-sectional views of a 3D NAND block 602 comparable to one of the blocks of FIG. 5, the successive views corresponding to successive configurations of block 602 as it is subjected to a contact structure formation process according to the current state of the art to allow the creation of interconnections between the bit lines (not shown) and underlying conductive layers of block 602. Like components in FIGS. 6A-6C will be referred to with like reference numerals as compared with reference numerals in FIG. 5. Block 602 includes a word line stack including a plurality of word lines 202 and a plurality of interlayer dielectrics 505. Although the block 502 of FIGS. 6A-6C shows more layers of word lines and interlayer dielectrics than those shown in FIG. 5, it is to be understood that both the depictions of the stacks in FIGS. 5 and 6A-6C (and 7A-7E as will described later), are merely schematic depictions, and that a stack as implemented in a 3D NAND product may have any number of word lines, such as up to about 160, or even more, word lines. FIGS. 6A-6C further show the following components, which may be similar or correspond to their counterparts as described above in relation to FIG. 5: pillars 513, vias 615a, 615b and 615c to allow the subsequent formation of first contact structures 514a, second contact structures 514b, third contact structures 514c, substrate structure 522, and staircase 525. Block 602 further shows additional stopping layers 610 which may be provided between groups of stacks of word lines 202 and interlayer dielectrics 505 by way of example. An insulating layer 612 is provided to cover the staircase 525. The insulating layer 612 may envelope the staircase 525, and may for example include a bonding dielectric layer, having a predetermined thickness, and including, for example, at least one of, for example, SiO, SiN, SiCN, SiOC, SiON, and SiOCN. Insulating layer 612 may, for example, include silicon dioxide or any other suitable second etch stop layer.

Reference will now be made to a manner of forming interconnections to the word lines 202 at portions thereof forming the staircase 525, and to the substrate 522 (and hence to the control circuitry therein—now shown) according to the state of the art. Although the word lines will be referred to in multiple instances below as being made of a polysilicon material, and the interlayer dielectrics as being made of an oxide material, it is to be understood, as noted above in relation to FIG. 5, that embodiments are not so limited, and include within their scope the provision of word lines made of a conductive material, and of interlayer dielectric layers made of an insulating material.

As seen in FIGS. 6A-6C, a 3D NAND block 602 or stack may include alternating layers of word lines and interlayer dielectrics, where contact structures 514b and 514c (FIG. 5), are needed to provide interconnections between the word lines 202 and the substrate 522 on the one hand, and the corresponding bit lines (not shown in FIGS. 6A-6C) on the other hand. The interconnections (including contact structures 514b and 514c) may be created by first creating a lithographic pattern for the vias 615b and 615c, etching vias down to the corresponding conductive layers below, and thereafter filling the vias 615b and 615c with a conductive material to achieve contact structures 514b and 514c such as those shown in FIG. 5. In order to etch the vias all the way down to each corresponding conductive layer, an initial stage may involve the etching of the vias 615b and 615c (that is, the vias to extend down to the staircase and possibly also to the substrate structure) to stop at a first etch stop layer 614, such as one including nitride.

This initial stage is shown in FIG. 6A. The etch is controlled to remove only the material of the insulating layer 612 and to have therefore high selectivity to the insulating layer 612 while stopping at the first etch stop layer, so that each via stops when the first etch stop layer 614 is reached as shown.

A subsequent stage, as shown in FIG. 6B, for the formation, according to the state of the art, of interconnections between the word lines and the substrate 522 on the one hand, and bit lines on the other hand, is an etch process that etches the first etch stop layer and therefore has high selectivity to the first etch stop layer, so that it can stop at an underlying second etch stop layer 616, such as an second etch stop layer 616 including an oxide.

Recall that etch selectivity between two materials is defined as the ratio between their etching rates for a given etch process at identical plasma conditions. High selectivity is usually referred to in etching and related to a high etching rate ratio between chemically different materials or between the etched and the underlying layer. In the instant case, ideally, a high enough selectivity as between the material of the first etch stop layer and the material of the second etch stop layer would be referring to a high etching rate ratio between the first etch stop layer and the second etch stop layer, which in turn would mean that the first etch stop layer would be etched but the second etch stop layer would, ideally, serve as an etch stop layer Next generation 3D NAND memory devices present more tiers (more stacks of word lines and interlayer dielectrics) and therefore more depth as those of their predecessors. Today's oxide-poly-oxide-poly (OPOP) staircase (corresponding to dielectric layer 502, word line 202, dielectric layer 505, word line 202 of FIG. 5) requires vias having maximum depths of only about 35 nm for contact structures, and are not scalable as word line tiers and depths scale up. Newer generation 3D NAND devices currently present 48 more tiers and a deeper depth of about 4.5 microns as compared with their predecessors. The reach of vias in newer generation devices may run from about 200 nm up to 13 microns, and next generation devices may require even deeper vias. However, balancing etch rates and etch selectivity (as defined above) for etching the first etch stop layer becomes more challenging for any given via as device depth increases. First, shallower vias tend to allow a faster etch of the underlying layer, while deeper vias tend to exhibit a slower etch of the underlying layer. This is where etch rate is a factor. Moreover, where vias of varying depths are involved, the depth variation can have an effect on etch outcomes, as is the case for example with the vias or vias 615b or 615c in FIGS. 6A-6C, as shown for example in FIG. 6B. Based on the etch selectivity of the etch process involved, vias 615a toward a top region of the staircase 525 may exhibit an overetch and potentially even extend beyond the first etch stop layer (because selectivity is not perfect), or stop at the second etch stop layer 616 (as planned), because of the faster etch rate at this top region, while vias 615b toward a bottom region of the staircase (closest to the substrate 522) may not punch through the first etch stop layer as planned (because depth is a factor that affects etch rates), and leave first etch stop layer material, such as nitride, remaining at the bottom of these vias. There are intermediate regions below the top region of the staircase and above the bottom region of the staircase at which the vias may land as planned. The latter would be, as suggested above, because of the slower etch rate of the first etch stop layer at this bottom region, and the difficulty of having perfect etch selectivity as between the first etch stop layer and the second etch stop layer. Mitigating the above punch through variations as device depths increase may be sought to be achieved through contact etch process improvements. However, such improvements would require a nitride to oxide selectivity of more than 10-15:1 in the vias, which selectivity may be hard to achieve.

In the context of the instant description, with respect to descriptions of the staircase and the staircase etch stop layer, "top" refers to a region of the array furthest from the substrate, "bottom" refers to a region of the array closest to the substrate, A being "below" B refers to a relative position of A with respect to B where A is closer to the substrate than B, and A being "above" B refers to a relative position of A with respect to B where A is further from the substrate than B.

Using an etchant to etch the first etch stop layer long enough to punch through the first etch stop layer toward the region of the staircase closer to the substrate may result in an unintended etching of the second etch stop layer toward the region of the staircase further from the substrate, and this would be because of the faster etch rates toward this latter region of the staircase, and because of the difficulty of achieving perfect selectivity of the etch intended for the first etch stop layer. Thus, for deeper 3D NAND devices with longer staircases, a given etch process with a given etch selectivity may result in significant via depth variations from one end of the 3D NAND staircase to the other end, and result overetch in upper regions (regions furthest from the substrate 522) and unetched/remaining material sought to be etched in opposite regions (regions closest to the substrate 522).

Referring now to FIG. 6C, a further etch process to punch through the second etch stop layer 616 (oxide), may continue the overetch. The etch process to punch through the second etch stop layer 616 is to allow the vias 616b to contact the word lines. However, the overetch may cause some vias to shoot past the oxide, and potentially punch through some word lines onto underlying word lines, creating a word line to word line bridge 618, create recesses 620 in word lines by etching through some of the word lines, or not succeed in punching through the first etch stop layer in regions near the substrate because of the different etch rates with deeper vias. The amount of overetch may, depending on the depth of the device, be significant, for example, up to about 500% overetch. As demonstrated by the example of FIGS. 6A-6C, the state of the art makes it difficult to reliably punch through the first etch stop layer to end on the underlying second etch stop layer, and to reliably etch the second etch stop layer without punching through the word lines.

Theoretically, the vias or vias are to be filled with conductive material (such as tungsten or polysilicon) to provide interconnections for the word lines and for the control circuitry (such as CMOS logic) within the substrate to drive the array. However, as suggested by the example of FIG. 6C, providing such interconnections would not be feasible given the issues related to overetch and underetch regions noted above. FIGS. 6B and 6C demonstrate the fact that first etch stop layer film thickness variations across the depth of the 3D NAND block staircase can induce a first etch stop layer punch challenge for the etch to actually eventually stop on the word lines for contact structure formation.

As technology advances toward next generation 3D NAND devices, a contact etch to provide vias may need to cover at least 48 more tiers as compared with current staircase structures, and depth increases of at least 4.5 microns. This introduces a challenge to remove the nitride etch stop film yet keep high selectivity to the underlying oxide layer.

It is noted that the etch processes referred to herein may be wet or dry, with wet etches typically providing a higher selectivity than dry etches.

According to embodiments, instead of a dual layer structure including a first etch stop layer on a second etch stop layer on the word line staircase, a sandwich etch stop layer is provided. The sandwich etch stop layer includes at least three etch stop layers: a first etch stop layer and a third etch stop layer made of a same or similar etch stop layer material, such as a dielectric, for example a nitride, and a second etch stop layer sandwiched between the first etch stop layer and the third etch stop layer, the second etch stop layer made of an etch stop layer material different from the material of the first etch stop layer and the third etch stop layer, such as an oxide. The material of the first etch stop layer and of the second etch stop layer may be the same or similar, in that their etch behavior when exposed to a same etch process would be identical. Hereinafter, the material of the first etch stop layer and of the second etch stop layer may be referred to as the first material, although it is to be understood that these materials may potentially have different chemical compositions as long as they behave similarly when exposed to a same etch process. The material of the third etch stop layer (the second material) may be different from the first material in that one etch process may present a high selectivity between the first material and the second material. According to one embodiment, the first material is a nitride material, and the second material is an oxide material, the sandwich thus presenting a nitride-oxide-nitride (NON) configuration. The NON configuration would, according to one embodiment, overlie a fourth etch stop layer such as one made of oxide, forming a NONO etch stop layer.

The second oxide layer acts as an etch stop layer for the precut of the first etch stop layer, and the third oxide layer acts as an etch stop layer for a deep word line etch. A thickness of the sandwich etch stop layer may be determined based on application needs and etch processes being used.

An embodiment of a sandwich etch stop layer is shown in FIGS. 7A-7E.

Reference is now made to FIGS. 7A-7E, which show successive side cross-sectional views of a 3D NAND block 702 comparable to block 602 of FIGS. 6A-6C, the successive views corresponding to successive configurations of block 702 as it is subjected to a contact structure formation process according to some embodiments to allow the creation of interconnections between the bit lines (not shown) and underlying conductive layers of block 702. Like components in FIGS. 7A-7E will be referred to with like reference numerals as compared with reference numerals in FIGS. 6A-6C. Block 702 includes a word line stack including a plurality of word lines 202 and a plurality of interlayer dielectrics 505, similar to the configuration described above in the context of FIGS. 6A-6C. FIGS. 7A-7E further show the following components, which may be similar or correspond to their counterparts as described above in relation to FIGS. 6A-6C and FIG. 5: pillars 513, vias or vias 615a, 615b and 615c to allow the subsequent formation of first contact structures 514a, second contact structures 514b, third contact structures 514c, substrate structure 522, staircase 525, and insulating layer 612. Block 702 further shows additional stopping layers 610 which may be provided between groups of stacks of word lines 202 and interlayer dielectrics 505 by way of example.

Figure 7A:
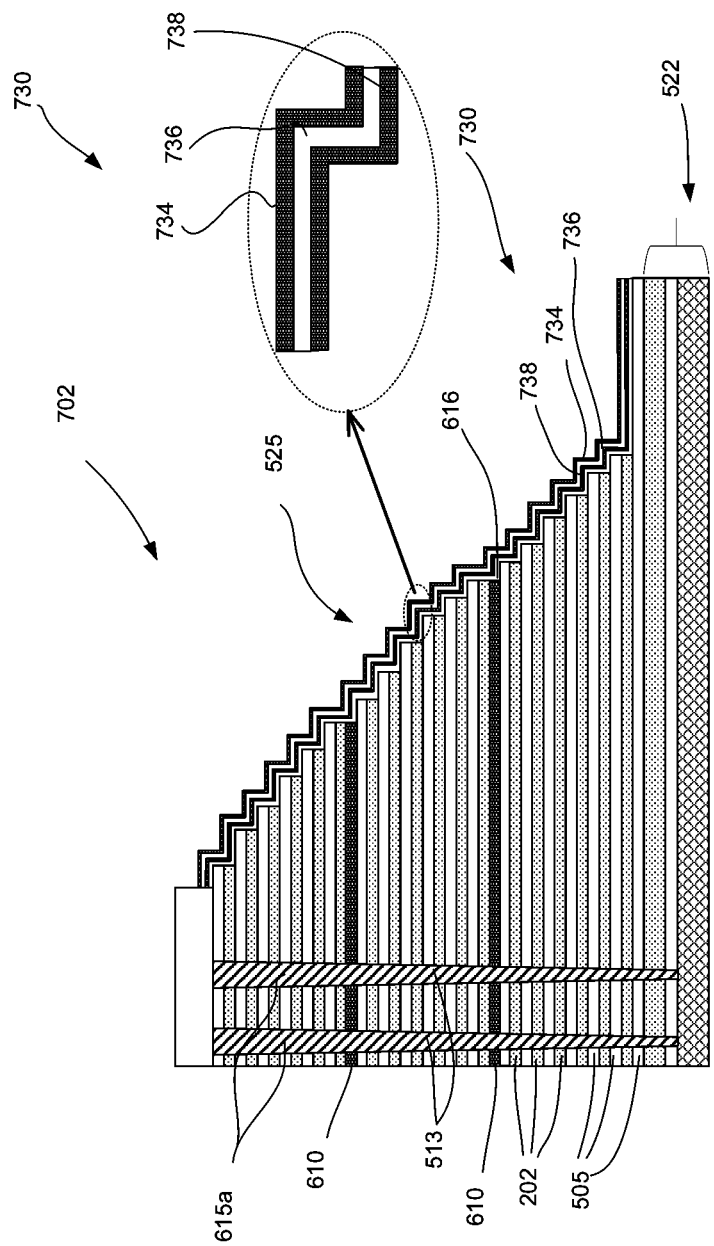

As shown in FIG. 7A, instead of a dual layer structure including a first etch stop layer 614 on a second etch stop layer 616 on the word line staircase, a sandwich etch stop layer 730 is provided. This sandwich layer may cover not only the staircase as shown, but also the bottom SGD connection at the substrate as shown, and also the SGS connection at the region above the pillars (not shown). The sandwich etch stop layer 730 includes at least three etch stop layers: a first etch stop layer 734 and a third etch stop layer 738 made of a same or similar etch stop layer material, such as a dielectric, for example a nitride, and a second etch stop layer 736 sandwiched between the first etch stop layer and the third etch stop layer, the second etch stop layer 736 made of an etch stop layer material different from the material of the first etch stop layer and the third etch stop layer, such as an oxide. The material of the first etch stop layer 734 and of the third etch stop layer 738 may be the same or similar, in that their etch behavior when exposed to a same etch process would be identical. Hereinafter, the material of the first etch stop layer and of the second etch stop layer may be referred to as the first material, although it is to be understood that these materials may potentially have different chemical compositions as long as they behave similarly when exposed to a same etch process. The material of the third etch stop layer 736 (the second material) may be different from the first material in that one etch process may present a high selectivity between the first material and the second material. According to one embodiment, the first material is a nitride material, and the second material is an oxide material, the sandwich thus presenting a nitride-oxide-nitride (NON) configuration.

FIG. 7A shows therefore the provision, such as by way of deposition, of a sandwich etch stop layer 730 at least one the word line staircase 525. The provision of the sandwich etch stop layer 730 allows a precut of the first etch stop layer 734 toward a lower region of the staircase 525 (region of the staircase closer to the substrate 522) prior to contact via/trench formation by way of etching. The precut advantageously helps to mitigate against etch rate and etch selectivity effects for word line staircases presenting a significant enough depth to cause etch stop layer punch through variations as shown by way of example in FIGS. 6B and 6C. The mitigation happens in part because the precut would effectively present a thinner etch stop layer at the lower region and a thicker etch stop layer at the higher of the staircase (furthest from the substrate 522), in this case substantially compensating for etch variations caused by variations in contact via/trench depths.

Figure 7B:
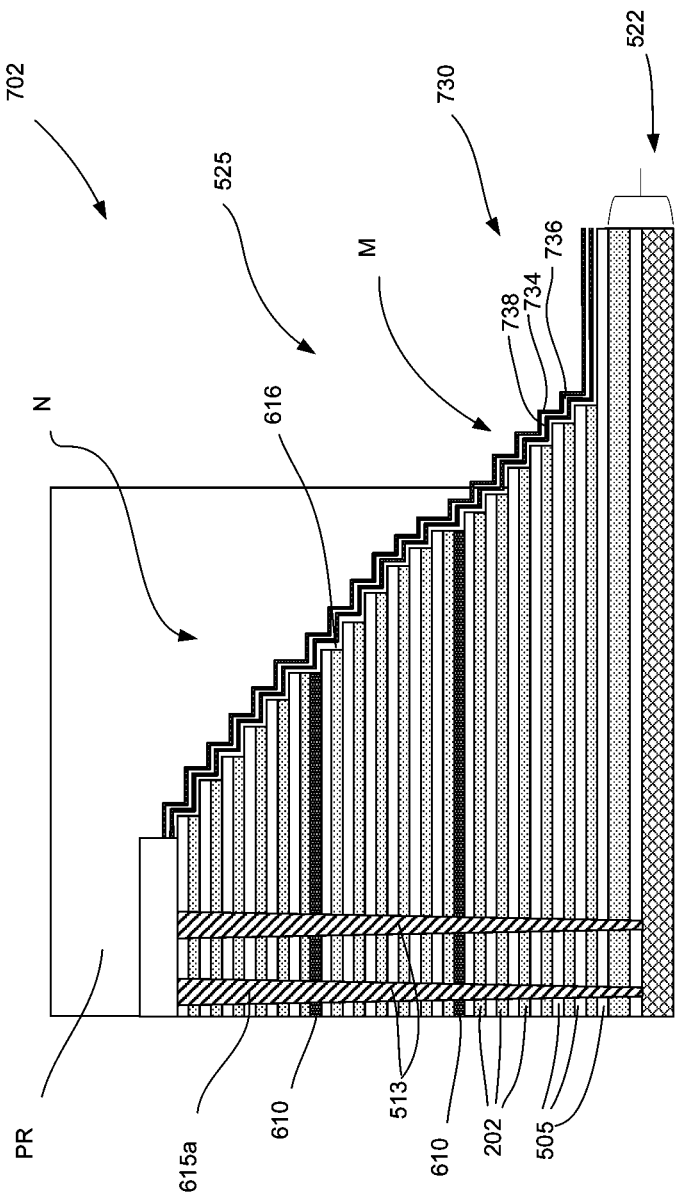

Referring now to FIG. 7B, a photoresist PR may be deposited onto the block 702 over a predetermined number N of steps of the word line staircase, sparing a predetermined number M of steps of the word line staircase. The predetermined numbers N and M may be determined empirically, for example based on etch performance and/or based on etch simulations suggesting potential areas of overetch and underetch for a given etch process, as will be explained in further detail in relations to FIGS. 8 and 9 below.

Figure 7C:
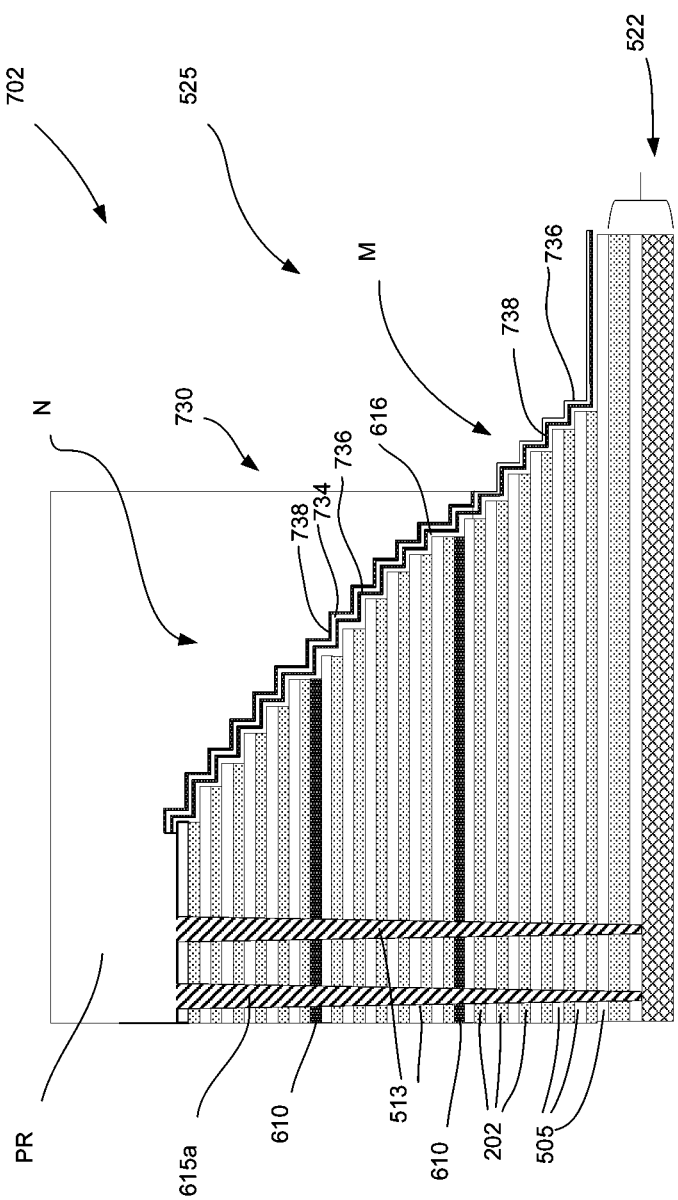

Referring now to FIG. 7C, a precut is performed on the first etch stop layer by using an etch process with high selectivity to the first material to remove the first etch stop layer on the M number of steps of the word line staircase at the lower region of the same, the etch being preferably a wet etch, although a dry etch is also possible. The precut results in the exposure of the second etch stop layer 736 in for the M number of steps below the PR. An advantage of the second etch stop layer is that it provides an etch stop to an etchant that is highly selective to the first material of the first etch stop layer, in this way providing more control with respect to the precut in the deeper via regions.

Figure 7D:
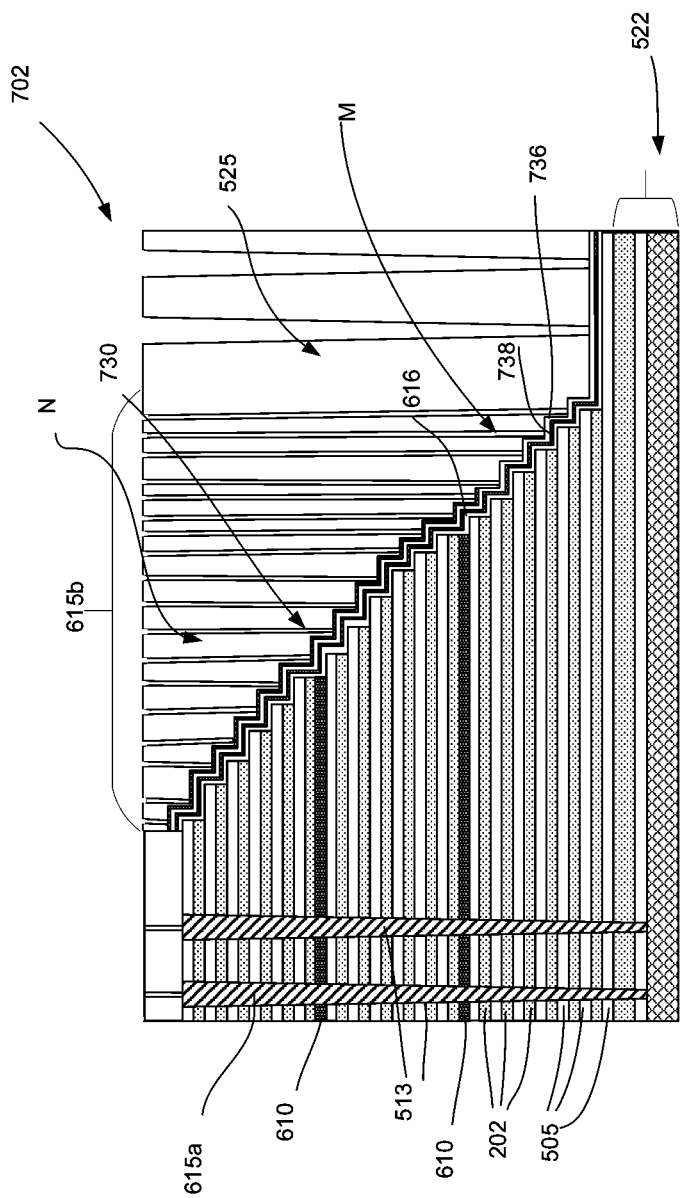

Referring now to FIG. 7D, the PR may be removed, an insulating material deposited on the block 702, and an etch with high selectivity to the insulating material performed to form vias 615b and 615c. Because of the precut, a number M of the vias 615b, and possibly vias 615c, will stop at the second etch stop layer 736 at a lower region of the staircase 525, while a number N of the tranches 615b will stop at the first etch stop layer 734 at an upper region of the staircase 525 as shown. As can be seen in FIG. 7D, the provision of a sandwich stop layer 730 and the subsequent precut allows an etch stop layer (which may be made up of multiple etch stop layers) to present different thicknesses for a subsequent etch of the vias down the corresponding conductive layers based on a depth of the vias. The deeper M vias may present a thinner etch stop layer (including, in the shown embodiment, the second etch stop layer 736 and the third etch stop layer 738 by virtue of the precut), and the shallower N vias may present a thicker etch stop layer including the sandwich etch stop layer 730. The variation in thickness of the etch stop layer is to mitigate overetch or underetch based on via depth. Vias 615a may also be provided at this time using a same etch or at a different time, using a different etch.

Subsequent to FIG. 7D, as seen in FIG. 7E, a subsequent etch may be performed that has high selectivity to both the first material, the second material, and the interlayer dielectric material of interlayer dielectric layers 505, and a low selectivity to the material of the word line, such as a polysilicon. In this way, the subsequent etch would be: (1) for the M vias, etching through the sandwich etch stop layer and both the first material of the first etch stop layer, the second material of the second etch stop layer, the first material of the third etch stop layer, and the dielectric material of layers 505 to reach the conductive layers such as word lines; and (2) for the N vias, etching through the second material of the second etch stop layer, the first material of the third etch stop layer, and the dielectric material of layer 505 to reach the conductive layers such as word lines. In this way, because of etch rate and selectivity variations across via depths, deeper vias with slower etch rates would present a thinner etch stop layer to etch through (mitigating underetch at deeper vias), while shallower vias with faster etch rates would present a thicker etch stop layer to etch through (mitigating overetch at shallower vias). The precut and resulting thickness variation of an etch stop layer in the M and N regions may automatically substantially offset etch variations based on via depth, resulting in a more reliable formation of vias for the provision of contact structures 514a, 514b and 514c in 3D NAND structures.

The vias could then be filled with a conductive material according to known methods to provide contact structures 514a, 514b and 514c such as those shown in FIG. 5.

The at least three stop layers of the sandwich etch stop layer (such as three layered etch stop layer 730) may, according to embodiments, include multiple layers, such as, for example, a first, third, fifth up to a maximum odd numbered etch stop layer made of the first material, and a second, fourth, sixth up to a maximum even numbered etch stop layer made of the second material, the maximum even number being less than the maximum odd number. This layered approach to an etch stop layer could then be used to cover the staircase of a 3D NAND block. Thereafter, a first PR may be provided to cover a first number of steps on the staircase to etch away the first etch stop layer, a second PR may be provided to cover a second number of steps larger than the first number to etch away the second etch stop layer and the third etch stop layer (either through a single etch process or through two successive etch processes), and so forth, in this way achieving an etch stop layer with successively decreasing thickness from the bottom region of the staircase to the top region of the staircase prior to via formation for the contact structures. For every x number of etch stop layers of the first material, according to some embodiments, x−1 PRs and at least x−1 etch processes may be provided.

Figure 8:
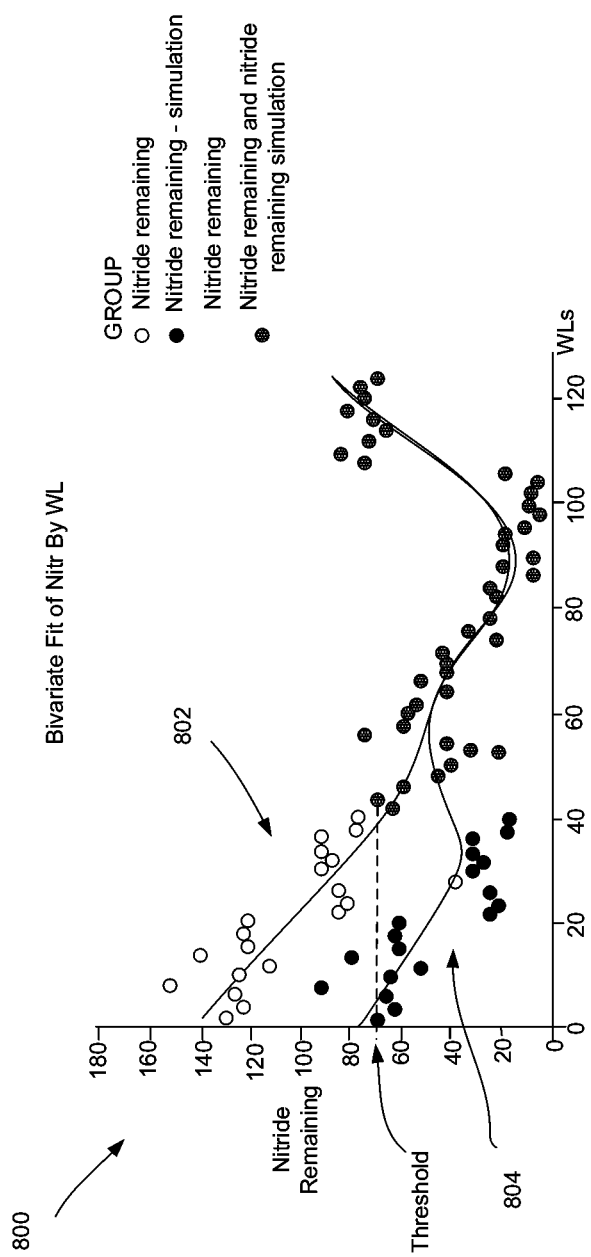
FIG. 8 is a graph of a bivariate fit of nitride remaining after an nitride etch in the formation of contact vias above word lines of a 3D NAND device.

FIG. 8 shows a graph 800 corresponding to a bivariate fit of nitride remaining (as measured on the vertical axis) versus the word line number of a 3D NAND device with at least 120 word lines (as shown on the horizontal axis) in a block similar to blocks 602/702. In particular, upper graph 802 has data points shown in the form of white circles up until word line 40, and then grey circles thereafter, and lower graph 804 with data points shown in the form of black circles up until word line 40, and then grey circles thereafter, the grey circles for graphs 802 and 804 corresponding to one another, and graphs 802 and 804 therefore merging at around word line 60 as shown. Graph 804 may be obtained by way of simulation, and graph 802 either by way of simulation or empirically. It is noted that the word line numbers in graph 800 are counted from the bottom of the staircase structure of the 3D NAND memory block in question, with word line 0 corresponding to the word line deepest within the block, and word lines 120+ corresponding to word lines closest to the top of the staircase (corresponding to a region closest to the device bit lines). The nitride remaining on the vertical axis is measured in terms of a thickness of the nitride layer remaining in nanometers, and depicts an example of the amount of nitride remaining above each word line indicated on the horizontal axis after the etch process to remove a nitride stop layer. In particular, graph 802 shows the nitride remaining plotted against the word line number after the etch process of the etch stop layer described for example in FIG. 6B (the current state of the art), and graph 804 shows the nitride remaining plotted against the word line number after the etch process shown in FIG. 7C to remove the first nitride etch stop layer 734.

Referring in particular to graph 802, for the current state of the art, there would be more nitride remaining at the bottom region of the staircase because of etch rate and selectivity variations across via depths, deeper vias with slower etch rates would present a thinner etch stop layer to etch through (mitigating underetch at deeper vias), while shallower vias with faster etch rates would present a thicker etch stop layer to etch through (mitigating overetch at shallower vias). The deeper (lower) regions would show more nitride remaining, while the shallower (upper) region would show less nitride remaining. Referring next to graph 804, the precut (for example as shown in FIG. 7C) and resulting thickness variation of an etch stop layer in the M and N regions may automatically substantially offset etch variations based on via depth, resulting in a more reliable formation of vias for the provision of contact structures in 3D NAND structures.

Looking to regions of the graphs 802 and 804 beyond about word line 90, we can see a rise in the amount of nitride remaining. This rise cannot be explained by way of the underetch phenomenon arising from etch result variations resulting from the depth variations of vias being formed, but rather on other factors, such as, for example, the provision of smaller (as in, having smaller landing areas) vias toward the top region of the staircase (above about word line 90), which smaller vias typically provide slower etch rates. A noteworthy feature of graph 100 is therefore the portion of the graph from word line zero to about word line 90 which explained variations in overetch/underetch as explained above, as we expect the same via landing area for those word lines. The landing areas for the deeper region is constrained in part because of the limited size of the steps.

Referring still to FIG. 8, the nitride remaining as defined above for the case without a sandwich etch stop layer (graph 802) and a case with the sandwich stop layer (graph 804) is substantially the same for the nitride remaining from about word line 40 and upward toward word line 120 plus. Recall that graph 804 is obtained by way of simulation, which may be obtained for example by way predicting the nitride remaining distribution across word lines with a sandwich NON etch stop layer according to one embodiment.

Looking at graph 804, it is possible to see that mitigation for the overetch/underetch issues outline for example with respect to FIGS. 6A-6C would be beneficial for the deeper word lines from about word line zero to about word line 40 where the graph 802 and graph 804 diverge. Therefore, referring back to FIG. 7B, the photoresist PR would be place, according to one embodiment, to cover word lines up to a word line where the amount of nitride remaining as between a nitride etch process involving a single nitride layer on the one hand (graph 802) and one involving a sandwich etch stop layer including NON on the other hand (graph 804) would diverge. The latter happens in the case of the example of FIG. 8 at about word line 40. Therefore, in the case of FIG. 8, PR would be provided from a topmost word line down to word line 40. The precut would then happen from word line zero to word line 40.

As suggested by the above description regarding the data points and graphs of FIG. 8, the provision of a photoresist layer PR may define the top region of the staircase structure, and the top region may be defined by the photoresist to end at a word line (in the case of FIG. 8, word line 40) below which a thickness of the first material remaining, after a hypothetical etch process of the first material had the staircase etch stop layer included the first etch stop layer as a single layer of the first material (this would correspond to the white data points based on which graph 802 is generated), is above a threshold (in the case of FIG. 8, above the threshold corresponding to a thickness of nitride remaining of about 75 nm). The threshold may, according to an embodiment, be based on a maximum thickness of the first material that would substantially avoid an underetch resulting from the first etch process.

According to one embodiment a sandwich etch stop layer is provided on an underlying etch stop layer, such as an oxide layer (e.g. layer 616) covering a 3D NAND staircase structure, the sandwich layer including a NON layer, the NON layer including a Nitride 2 layer, an oxide layer, and a Nitride 1 layer above the underlying oxide layer. Nitride 2 is removed for the deeper region of staircase with photo resist protection on the shallow region of the staircase. The middle oxide layer acts as an etch stop layer when Nitride 2 is being removed, thus allowing a more controlled and predictable subsequent etch down to the word lines.

With a deep word line Nitride 2 pre-cut as suggested for example in FIGS. 7A-7E, the nitride remaining variation post contact etch can be reduced, as seen in the example of FIG. 8, from 140 nm (white data circles in FIG. 8 near word line zero) to 90 nm (black data circles in FIG. 8 near word line zero), which significantly reduces subsequent nitride punch challenges. As suggested in FIG. 8, the Nitride 2 thickness and photoresist cover area can be customized based on the nitride remaining distribution post contact etch.

Figure 9:
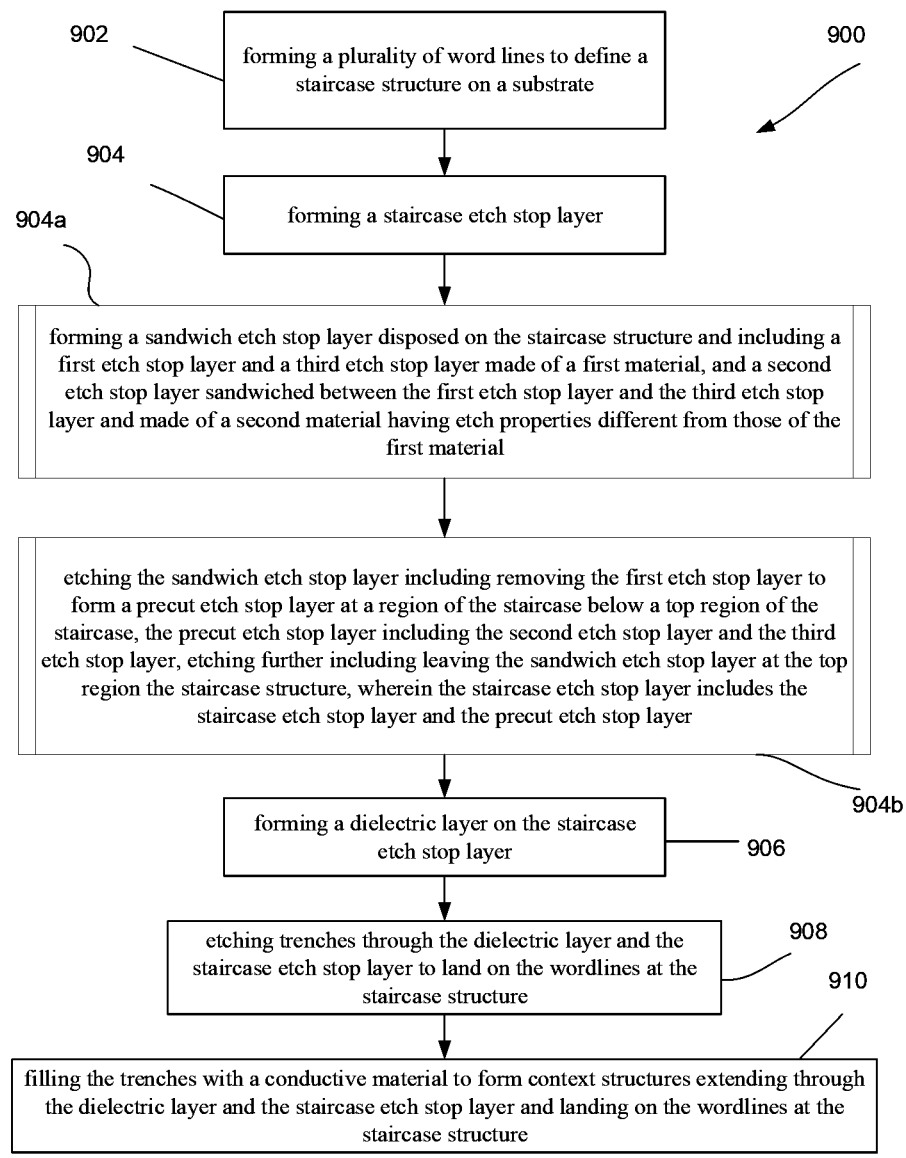
FIG. 9 is a flow diagram of a process according to some embodiments.

FIG. 9 shows a method 900 of forming a memory array according to an embodiment. At operation 902, the method includes forming a plurality of word lines to define a staircase structure on a substrate. At operation 904, the method includes forming a staircase etch stop layer. Operation 904 includes operations 904a and 904b. Operation 904a includes forming a sandwich etch stop layer disposed on the staircase structure and including a first etch stop layer and a third etch stop layer made of a first material, and a second etch stop layer sandwiched between the first etch stop layer and the third etch stop layer and made of a second material having etch properties different from those of the first material. Operation 904b includes etching the sandwich etch stop layer including removing the first etch stop layer to form a precut etch stop layer at a region of the staircase below a top region of the staircase, the precut etch stop layer including the second etch stop layer and the third etch stop layer, etching further including leaving the sandwich etch stop layer at the top region the staircase structure, wherein the staircase etch stop layer includes the staircase etch stop layer and the precut etch stop layer. At operation 906, the method includes forming a dielectric layer on the staircase etch stop layer. At operation 908, the method includes etching vias through the dielectric layer and the staircase etch stop layer to land on the word lines at the staircase structure. At operation 910, the method includes filling the vias with a conductive material to form contact structures extending through the dielectric layer and the staircase etch stop layer and landing on the word lines at the staircase structure.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122, memory chips 123, controllers 126, storage device controller 118, address translation engine 120, program control logic 124, memory array 200, page buffer 602, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Examples of some embodiments are provided below.

Example 1 includes an apparatus comprising: a substrate including control circuitry therein; a memory array electrically coupled to the control circuitry and including a plurality of word lines disposed to define a staircase structure, and a staircase etch stop layer including: a sandwich etch stop layer disposed on a top region the staircase structure furthest from the substrate and including a first etch stop layer and a third etch stop layer made of a first material, and a second etch stop layer sandwiched between the first etch stop layer and the third etch stop layer and made of a second material having etch properties different from those of the first material; a precut etch stop layer disposed at a region of the staircase structure below the top region and including the second etch stop layer and the third etch stop layer and not the first etch stop layer; a dielectric layer on the staircase etch stop layer; and contact structures extending through the dielectric layer and the staircase etch stop layer and landing on the word lines at the staircase structure.

Example 2 includes the subject matter of Example 1, and optionally, wherein the staircase etch stop layer includes an underlying etch stop layer disposed between the staircase structure and the staircase etch stop layer.

Example 3 includes the subject matter of Example 1, and optionally, wherein the first material includes a nitride, and the second material includes an oxide.

Example 4 includes the subject matter of Example 1, and optionally, wherein: the sandwich etch stop layer further includes a fourth etch stop layer made of the second material, and a fifth etch stop layer made of the first material, the fourth etch stop layer between the third etch stop layer and the fifth etch stop layer; and the precut etch stop layer is a first precut etch stop layer, and the region of the staircase structure below the top region is a first region of the staircase structure below the top region, wherein the staircase etch stop layer further includes a second precut etch stop layer disposed at a second region of the staircase structure below the top region and below the first region, the second precut etch stop layer including the fourth etch stop layer and the fifth etch stop layer and not the first etch stop layer, the second etch stop layer or the third etch stop layer.

Example 5 includes the subject matter of Example 1, and optionally, wherein the staircase etch stop layer is further disposed on regions of the device beyond the staircase structure.

Example 6 includes the subject matter of Example 5, and optionally, wherein the staircase etch stop layer is disposed on at least one of a region on the substrate beyond the staircase structure and a region on the plurality of word lines.

Example 7 includes a method of forming a memory array including: forming a plurality of word lines to define a staircase structure on a substrate; forming a staircase etch stop layer including: forming a sandwich etch stop layer disposed on the staircase structure and including a first etch stop layer and a third etch stop layer made of a first material, and a second etch stop layer sandwiched between the first etch stop layer and the third etch stop layer and made of a second material having etch properties different from those of the first material; etching the sandwich etch stop layer including removing the first etch stop layer to form a precut etch stop layer at a region of the staircase below a top region of the staircase, the precut etch stop layer including the second etch stop layer and the third etch stop layer, etching further including leaving the sandwich etch stop layer at the top region the staircase structure, wherein the staircase etch stop layer includes the staircase etch stop layer and the precut etch stop layer; forming a dielectric layer on the staircase etch stop layer; etching vias through the dielectric layer and the staircase etch stop layer to land on the word lines at the staircase structure; and filling the vias with a conductive material to form contact structures extending through the dielectric layer and the staircase etch stop layer and landing on the word lines at the staircase structure.

Example 8 includes the subject matter of Example 7, and optionally, wherein etching vias includes: performing a first etch process to etch the vias to land on the staircase etch stop layer at the top region of the staircase structure, and to land on the second etch stop layer at the region of the staircase structure below the top region; and performing a second etch process to extend the vias to land on the word lines.

Example 9 includes the subject matter of Example 7, and optionally, wherein the staircase etch stop layer includes an underlying etch stop layer disposed between the staircase structure and the staircase etch stop layer.

Example 10 includes the subject matter of Example 7, and optionally, wherein the first material includes a nitride, and the second material includes an oxide.

Example 11 includes the subject matter of Example 8, and optionally, wherein performing the first etch process includes depositing a photoresist layer on the staircase structure to cover the top region of the staircase structure and such that the region of the staircase structure below the top region is not covered by the photoresist, depositing the photoresist being prior to etching the vias.

Example 12 includes the subject matter of Example 11, and optionally, wherein the top region of the staircase structure ends at a word line below which a thickness of the first material remaining, after a hypothetical etch process of the first material had the staircase etch stop layer included the first etch stop layer as a single layer of the first material, is above a threshold, the threshold based on a maximum thickness of the first material that would substantially avoid an underetch resulting from the first etch process.

Example 13 includes the subject matter of Example 7, and optionally, wherein: the sandwich etch stop layer further includes a fourth etch stop layer made of the second material, and a fifth etch stop layer made of the first material, the fourth etch stop layer between the third etch stop layer and the fifth etch stop layer; the precut etch stop layer is a first precut etch stop layer and the region of the staircase structure below the top region is a first region of the staircase structure below the top region; and etching the sandwich etch stop layer further includes, after removing the first etch stop layer, removing the second etch stop layer and the third etch stop layer to form a second precut etch stop layer at a second region of the staircase structure below the top region and below the first region, the second precut etch stop layer including the fourth etch stop layer and the fifth etch stop layer, wherein the staircase etch stop layer includes the staircase etch stop layer, the first precut etch stop layer and the second precut etch stop layer.

Example 14 includes the subject matter of Example 7, and optionally, wherein the staircase etch stop layer is further disposed on regions of the memory array beyond the staircase structure.

Example 15 includes the subject matter of Example 5, and optionally, wherein the staircase etch stop layer is disposed on at least one of a region on the substrate beyond the staircase structure and a region on the plurality of word lines.

Example 16 includes a system including: a controller including one or more processors; and a memory device coupled to the controller and including: a substrate including control circuitry therein; a memory array electrically coupled to the control circuitry and including a plurality of word lines disposed to define a staircase structure, and a staircase etch stop layer including: a sandwich etch stop layer disposed on a top region the staircase structure furthest from the substrate and including a first etch stop layer and a third etch stop layer made of a first material, and a second etch stop layer sandwiched between the first etch stop layer and the third etch stop layer and made of a second material having etch properties different from those of the first material; and a precut etch stop layer disposed at a region of the staircase structure below the top region and including the second etch stop layer and the third etch stop layer and not the first etch stop layer; a dielectric layer on the staircase etch stop layer; and contact structures extending through the dielectric layer and the staircase etch stop layer and landing on the word lines at the staircase structure.

Example 17 includes the subject matter of Example 16, and optionally, wherein the first material includes a nitride, and the second material includes an oxide.

Example 18 includes the subject matter of Example 16, and optionally, wherein: the sandwich etch stop layer further includes a fourth etch stop layer made of the second material, and a fifth etch stop layer made of the first material, the fourth etch stop layer between the third etch stop layer and the fifth etch stop layer; and the precut etch stop layer is a first precut etch stop layer, and the region of the staircase structure below the top region is a first region of the staircase structure below the top region, wherein the staircase etch stop layer further includes a second precut etch stop layer disposed at a second region of the staircase structure below the top region and below the first region, the second precut etch stop layer including the fourth etch stop layer and the fifth etch stop layer and not the first etch stop layer, the second etch stop layer or the third etch stop layer.

Example 19 includes the subject matter of Example 16, and optionally, wherein the staircase etch stop layer is further disposed on regions of the memory array beyond the staircase structure.

Example 20 includes the subject matter of Example 16, and optionally, wherein the staircase etch stop layer is disposed on at least one of a region on the substrate beyond the staircase structure and a region on the plurality of word lines.

Example 21 includes an device comprising: one or more processors and one or more computer-readable media comprising instructions that, when executed by the one or more processors, cause the one or more processors to perform the method, techniques, or process as described in or related to any of the Examples above, or portions thereof.

Example 22 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 23 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
    a substrate including control circuitry therein;
    a memory array electrically coupled to the control circuitry and including a plurality of word lines disposed to define a staircase structure, and a staircase etch stop layer including:
        a sandwich etch stop layer disposed on a top region the staircase structure furthest from the substrate and including a first etch stop layer and a third etch stop layer made of a first material, and a second etch stop layer sandwiched between the first etch stop layer and the third etch stop layer and made of a second material having etch properties different from those of the first material;
        a precut etch stop layer disposed at a region of the staircase structure below the top region and including the second etch stop layer and the third etch stop layer and not the first etch stop layer;
        a dielectric layer on the staircase etch stop layer; and
        contact structures extending through the dielectric layer and the staircase etch stop layer and landing on the word lines at the staircase structure.

2. The apparatus of claim 1, wherein the staircase etch stop layer includes an underlying etch stop layer disposed between the staircase structure and the staircase etch stop layer.

3. The apparatus of claim 1, wherein the first material includes a nitride, and the second material includes an oxide.

4. The apparatus of claim 1, wherein:
    the sandwich etch stop layer further includes a fourth etch stop layer made of the second material, and a fifth etch stop layer made of the first material, the fourth etch stop layer between the third etch stop layer and the fifth etch stop layer; and
    the precut etch stop layer is a first precut etch stop layer, and the region of the staircase structure below the top region is a first region of the staircase structure below the top region, wherein the staircase etch stop layer further includes a second precut etch stop layer disposed at a second region of the staircase structure below the top region and below the first region, the second precut etch stop layer including the fourth etch stop layer and the fifth etch stop layer and not the first etch stop layer, the second etch stop layer or the third etch stop layer.

5. The apparatus of claim 1, wherein the staircase etch stop layer is further disposed on regions of the apparatus beyond the staircase structure.

6. The apparatus of claim 5, wherein the staircase etch stop layer is disposed on at least one of a region on the substrate beyond the staircase structure and a region on the plurality of word lines.

7. A method of forming a memory array including:
    forming a plurality of word lines to define a staircase structure on a substrate;
    forming a staircase etch stop layer including:
        forming a sandwich etch stop layer disposed on the staircase structure and including a first etch stop layer and a third etch stop layer made of a first material, and a second etch stop layer sandwiched between the first etch stop layer and the third etch stop layer and made of a second material having etch properties different from those of the first material;
        etching the sandwich etch stop layer including removing the first etch stop layer to form a precut etch stop layer at a region of the staircase structure below a top region of the staircase structure, the precut etch stop layer including the second etch stop layer and the third etch stop layer, etching further including leaving the sandwich etch stop layer at the top region the staircase structure, wherein the staircase etch stop layer includes the staircase etch stop layer and the precut etch stop layer;
    forming a dielectric layer on the staircase etch stop layer;

etching vias through the dielectric layer and the staircase etch stop layer to land on the word lines at the staircase structure; and filling the vias with a conductive material to form contact structures extending through the dielectric layer and the staircase etch stop layer and landing on the word lines at the staircase structure.

8. The method of claim 7, wherein etching vias includes:

performing a first etch process to etch the vias to land on the staircase etch stop layer at the top region of the staircase structure, and to land on the second etch stop layer at the region of the staircase structure below the top region; and performing a second etch process to extend the vias to land on the word lines.

9. The method of claim 7, wherein the staircase etch stop layer includes an underlying etch stop layer disposed between the staircase structure and the staircase etch stop layer.

10. The method of claim 7, wherein the first material includes a nitride, and the second material includes an oxide.

11. The method of claim 8, wherein performing the first etch process includes depositing a photoresist layer on the staircase structure to cover the top region of the staircase structure and such that the region of the staircase structure below the top region is not covered by the photoresist layer, depositing the photoresist layer being prior to etching the vias.

12. The method of claim 11, wherein the top region of the staircase structure ends at a word line below which a thickness of the first material remaining, after a hypothetical etch process of the first material had the staircase etch stop layer included the first etch stop layer as a single layer of the first material, is above a threshold, the threshold based on a maximum thickness of the first material that would substantially avoid an underetch resulting from the first etch process.

13. The method of claim 7, wherein:

the sandwich etch stop layer further includes a fourth etch stop layer made of the second material, and a fifth etch stop layer made of the first material, the fourth etch stop layer between the third etch stop layer and the fifth etch stop layer;

the precut etch stop layer is a first precut etch stop layer and the region of the staircase structure below the top region is a first region of the staircase structure below the top region; and etching the sandwich etch stop layer further includes, after removing the first etch stop layer, removing the second etch stop layer and the third etch stop layer to form a second precut etch stop layer at a second region of the staircase structure below the top region and below the first region, the second precut etch stop layer including the fourth etch stop layer and the fifth etch stop layer, wherein the staircase etch stop layer includes the staircase etch stop layer, the first precut etch stop layer and the second precut etch stop layer.

14. The method of claim 7, wherein the staircase etch stop layer is further disposed on regions of the memory array beyond the staircase structure.

15. The method of claim 14, wherein the staircase etch stop layer is disposed on at least one of a region on the substrate beyond the staircase structure and a region on the plurality of word lines.

16. A system including:

a controller including one or more processors; and a memory device coupled to the controller and including:

a substrate including control circuitry therein;

a memory array electrically coupled to the control circuitry and including a plurality of word lines disposed to define a staircase structure, and a staircase etch stop layer including:

a sandwich etch stop layer disposed on a top region the staircase structure furthest from the substrate and including a first etch stop layer and a third etch stop layer made of a first material, and a second etch stop layer sandwiched between the first etch stop layer and the third etch stop layer and made of a second material having etch properties different from those of the first material; and a precut etch stop layer disposed at a region of the staircase structure below the top region and including the second etch stop layer and the third etch stop layer and not the first etch stop layer;

a dielectric layer on the staircase etch stop layer; and contact structures extending through the dielectric layer and the staircase etch stop layer and landing on the word lines at the staircase structure.

17. The system of claim 16, wherein the staircase etch stop layer includes an underlying etch stop layer disposed between the staircase structure and the staircase etch stop layer.

18. The system of claim 16, wherein the first material includes a nitride, and the second material includes an oxide.

19. The system of claim 16, wherein:

the sandwich etch stop layer further includes a fourth etch stop layer made of the second material, and a fifth etch stop layer made of the first material, the fourth etch stop layer between the third etch stop layer and the fifth etch stop layer; and the precut etch stop layer is a first precut etch stop layer, and the region of the staircase structure below the top region is a first region of the staircase structure below the top region, wherein the staircase etch stop layer further includes a second precut etch stop layer disposed at a second region of the staircase structure below the top region and below the first region, the second precut etch stop layer including the fourth etch stop layer and the fifth etch stop layer and not the first etch stop layer, the second etch stop layer or the third etch stop layer.

20. The system of claim 16, wherein the staircase etch stop layer is further disposed on regions of the memory array beyond the staircase structure.

21. The system of claim 16, wherein the staircase etch stop layer is disposed on at least one of a region on the substrate beyond the staircase structure and a region on the plurality of word lines.

* * * * *